United States Patent
Goh et al.

(10) Patent No.: US 11,305,988 B2
(45) Date of Patent: Apr. 19, 2022

(54) METHOD FOR PREPARING SILICON WAFER WITH ROUGH SURFACE AND SILICON WAFER

(71) Applicant: AAC ACOUSTIC TECHNOLOGIES (SHENZHEN) CO., LTD., Shenzhen (CN)

(72) Inventors: Wooicheang Goh, Singapore (SG); Lieng Loo, Singapore (SG); Kahkeen Lai, Singapore (SG)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 17/009,765

(22) Filed: Sep. 1, 2020

(65) Prior Publication Data
US 2022/0063995 A1    Mar. 3, 2022

(51) Int. Cl.
*B81C 1/00*    (2006.01)
*B81B 3/00*    (2006.01)

(52) U.S. Cl.
CPC ........ *B81C 1/00968* (2013.01); *B81B 3/0008* (2013.01); *B81B 3/0002* (2013.01); *B81B 3/0005* (2013.01); *B81B 3/0016* (2013.01); *B81B 2201/0235* (2013.01); *B81C 1/0096* (2013.01); *B81C 2201/11* (2013.01); *B81C 2201/115* (2013.01)

(58) Field of Classification Search
CPC ............. B81C 1/00968; B81C 2201/11; B81C 1/0096; B81C 2201/115; B81B 3/0008; B81B 3/0016; B81B 3/0005; B81B 3/0002; B81B 2201/0235

See application file for complete search history.

(56) References Cited

U.S. PATENT DOCUMENTS

| | | | | |
|---|---|---|---|---|
| 6,355,536 B1* | 3/2002 | Figura | ...................... | H01L 28/84 257/E21.013 |
| 7,851,239 B2* | 12/2010 | Webster | ............... | G02B 26/001 438/29 |
| 2009/0286347 A1* | 11/2009 | Kim | .................. | H01L 31/02363 438/72 |
| 2010/0065946 A1* | 3/2010 | Wilson | ................ | B81C 1/00952 257/618 |
| 2014/0167189 A1* | 6/2014 | Steimle | ................. | B81B 3/0005 257/415 |
| 2017/0313573 A1* | 11/2017 | Montez | ................... | B81B 3/001 |

* cited by examiner

*Primary Examiner* — Yasser A Abdelaziez
(74) *Attorney, Agent, or Firm* — W&G Law Group

(57) ABSTRACT

Provided are a method for preparing a silicon wafer with a rough surface and a silicon wafer, which solves the problem in the prior art that viscous force is likely to be generated. The method includes: depositing a first film layer having a large surface roughness on a surface of a silicon wafer that has been subjected to planar planarization, and then blanket etching the first film layer to remove the first film layer. Then, the surface of the first silicon layer facing away from the substrate is further etched to form grooves and protrusions, which provide roughness, thereby forming a silicon wafer with a rough surface. When the silicon wafer approaches to another film layer, the viscous force generated therebetween is reduced, and thus the sensitivity of the MEMS device is improved and the probability of out-of-work MEMS device is reduced.

8 Claims, 6 Drawing Sheets

METHOD FOR PREPARING SILICON WAFER WITH ROUGH SURFACE AND SILICON WAFER

FIELD

The invention relates to the technical field of silicon wafers, and particularly, to a method for preparing a silicon wafer with a rough surface and a silicon wafer.

BACKGROUND

The technology of Micro Electro Mechanical Systems (MEMS) is known as a revolutionary and interdisciplinary high-tech in the 21st century, which combines microelectronics and micromachines and well developed since 1960. Such a relatively new technology will have revolutionary impacts on human life in the future due to its various advantages such as microminiaturization, intelligence, executability, and capable of being integrated, good process compatibility and low cost, etc. Therefore, it has been widely used in many fields. For example, MEMS accelerators are commonly used in automobiles (for example, in airbag systems), tablet computers or smartphones.

MEMS devices are micromechanical devices that provide moving parts having a dimension less than 100 μm. These moving parts are formed with micromachining technology. The MEMS devices have holes, cavities, channels, cantilevers, membranes, etc. These devices are usually based on silicon materials (such as crystalline silicon wafers), with their physical structures formed by various techniques, and release these structures for movement.

In the preparation of the MEMS devices, when two surfaces having an area below a micron scale are very close to each other, due to static electricity and/or Van der Waals' force, the two surfaces may stick together to generate a viscous force which may reduce sensitivity of the device, for example, cause the parts in the MEMS device (for example, a rocker accelerometer) to freeze in place and become unusable. The MEMS devices known in the prior art are usually based on crystalline silicon wafers, whose surfaces are relatively smooth, i.e., with small surface roughness. However, when the smooth surface of the crystalline silicon wafer is close to another film layer, the two surfaces approaching each other are prone to generate a viscous force, which reduces the sensitivity of the MEMS device, and even makes the parts of the MEMS device immobile and unusable.

SUMMARY

In view of the above, embodiments of the present invention provide a method for preparing a silicon wafer with a rough surface and a silicon wafer, in order to solve the problems in the prior art, i.e., the smooth surface of the crystalline silicon wafer and a surface of another film layer approaching each other are prone to generate a viscous force, which reduces the sensitivity of the MEMS device and even makes the parts of the MEMS device immobile and unusable.

An embodiment of the present invention provides a method for preparing a silicon wafer with a rough surface, comprising: forming a substrate, wherein the substrate has a first region, a second region, and a third region along a first direction, and the first direction is perpendicular to a thickness direction of the substrate; depositing a first silicon layer on a surface of the substrate in the second region; depositing a dielectric layer on the surface of the substrate in the first region and the third region and on a surface of the first silicon layer facing away from the substrate; performing planar planarization on the dielectric layer to expose the first silicon layer and form a dielectric planar layer and a first silicon planar layer; depositing a first film layer on a side of the first silicon planar layer facing away from the substrate, wherein the first film layer is made of a material comprising amorphous silicon; and blanket etching the first film layer to remove the first film layer.

As an improvement, the first film layer and the first silicon layer are made of the same material.

As an improvement, the first film layer has a smaller thickness than the first silicon planar layer.

As an improvement, the thickness of the first film layer ranges from 0.05 μm to 0.6 μm, and the thickness of the first silicon planar layer ranges from 1 μm to 4 μm.

As an improvement, said depositing the first film layer on the side of the first silicon planar layer facing away from the substrate comprises: chemically or physically depositing the first film layer on the side of the first silicon planar layer facing away from the substrate.

As an improvement, said performing planar planarization on the dielectric layer comprises: performing chemical mechanical planarization on the dielectric layer.

As an improvement, after said blanket etching the first film layer, the method further includes: etching a surface of the first silicon planar layer facing away from the substrate to form grooves in the surface of the first silicon planar layer facing away from the substrate.

An embodiment of the present invention provides a silicon wafer. The silicon wafer includes: a substrate having a first region, a second region, and a third region along a first direction, the first direction being perpendicular to a thickness direction of the substrate; a dielectric planar layer disposed on the substrate in the first region and the third region; and a first silicon layer disposed on the substrate in the second region. The silicon wafer is prepared by the method as described above and has a rough surface.

In the embodiment of the present invention, the method for preparing a silicon wafer with a rough surface includes: depositing a first film layer having a greater surface roughness on the surface of the first silicon planar layer that has been subjected to the planar planarization, then blanket etching the first film layer to increase the roughness of the surface of the first silicon layer facing away from the substrate, and then further etching the surface of the first silicon layer facing away from the substrate to form grooves, thereby forming the rough surface of the silicon wafer. In a subsequent preparation process of applying the silicon wafer to the MEMS device, the rough surface is maintained all the time, and thus, when the silicon wafer is close to another film layer, the viscous force generated between two surfaces approaching each other is reduced, thereby improving the sensitivity of the MEMS device and reducing the probability of the out-of-work MEMS devices.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

DESCRIPTION OF EMBODIMENTS

In order to explain the present invention, the embodiments of the present invention will be described in detail below with reference to the accompanying drawings.

It should be understood that the described embodiments are only a part of, but not all of the embodiments of the present invention. Based on the embodiments described in the present invention, all other embodiments, which are obtained by those skilled in the art without paying creative efforts, shall fall within the protection scope of the present invention.

The terms used in the embodiments of the present invention are merely for the purpose of describing specific embodiments, but not intended to limit the present invention. The singular forms "a", "an", "said" and "the" used in the embodiments of the present invention and the appended claims are also intended to include the plural forms thereof, unless the context clearly indicates otherwise.

It should be understood that the term "and/or" used herein is merely an association relationship describing associated objects, indicating that there may be three relationships. For example, A and/or B may indicate: A exists alone, both A and B exist, and B exists alone. In addition, the character "/" generally indicates that the related objects are in an "or" relationship.

Figure 1:
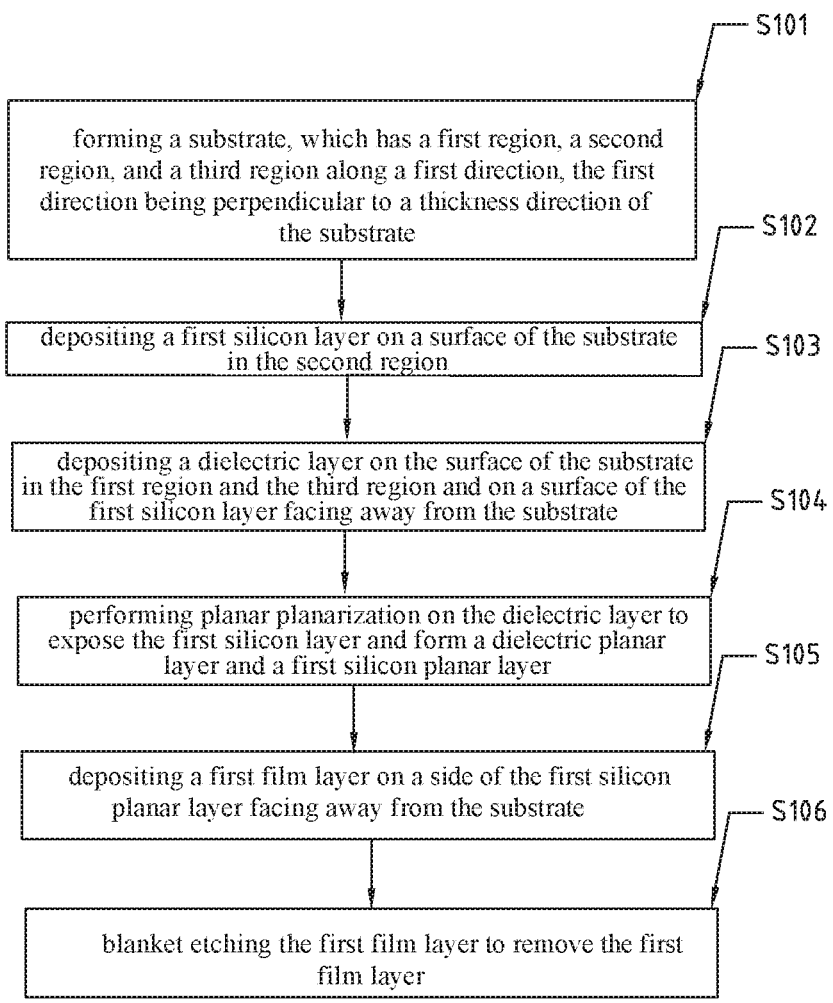
FIG. 1 is a flow diagram of a method for preparing a silicon wafer with a rough surface according to an embodiment of the present invention.

FIG. 1 is a schematic flow diagram of a method for preparing a silicon wafer with a rough surface provided by an embodiment of the present invention. As shown in FIG. 1, the method for preparing a silicon wafer with a rough surface includes the following steps S101 to S106.

Step S101: a substrate 1 is formed. The substrate 1 includes a first region, a second region, and a third region in a first direction, and the first direction is perpendicular to a thickness direction of the substrate 1.

Step S102: a first silicon layer 3 is deposited on the surface of the substrate 1 in the second region.

Step S103: a dielectric layer 2 is deposited on a surface of the substrate 1 in the first region and the third region as well as on a surface of the first silicon layer 3 facing away from the substrate 1.

Figure 2:
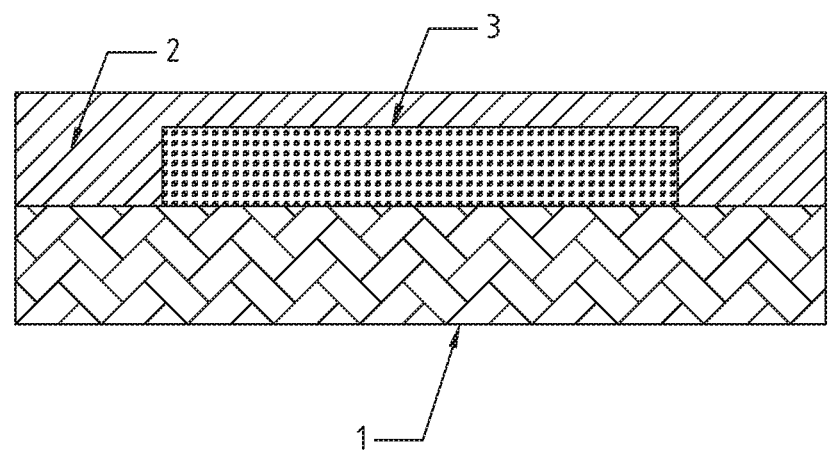
FIG. 2 is a structural schematic diagram of a silicon wafer after step S103 in the method shown in FIG. 1.

FIG. 2 illustrates the structure of the formed silicon wafer subjected to the steps S101 to S103.

Figure 3:
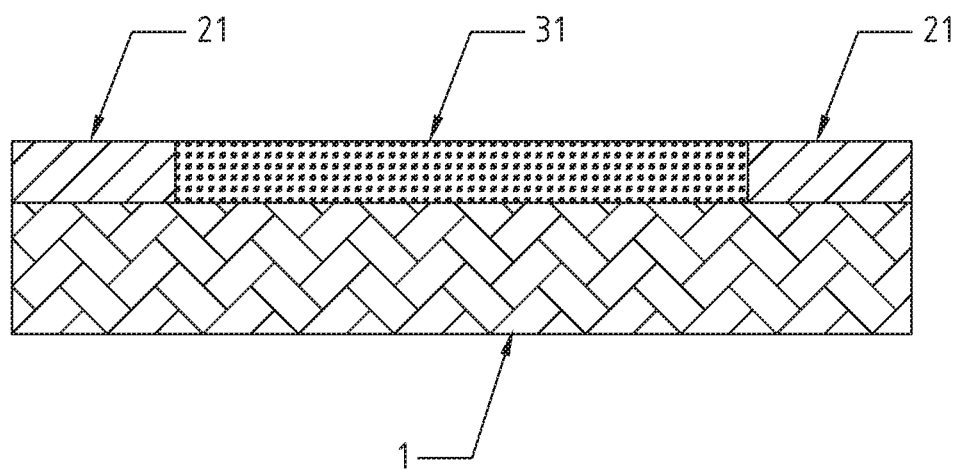
FIG. 3 is a structural schematic diagram of a silicon wafer after step S104 in the method shown in FIG. 1.

Step S104: a planar planarization is performed on the dielectric layer 2 to expose the first silicon layer 3, and to form a dielectric planar layer 21 and a first silicon planar layer 31, as shown in FIG. 3. At this time, each of the dielectric planar layer 21 and the first silicon planar layer 31 has an even thickness, and the thickness of the dielectric planar layer 21 is the same as the thickness of the first silicon planar layer 31.

However, although the dielectric planar layer 21 and the first silicon planar layer 31 have the even thickness after the planar planarization, a surface of the first silicon planar layer 31 facing away from the substrate 1 has a relatively smaller roughness. That is, the surface of the first crystalline silicon planar layer 31 facing away from the substrate 1 is relatively smooth. In this case, if the silicon wafer approaches another film layer in order to prepare an MEMS device, the two surfaces approaching each other are still prone to generate a viscous force, which reduces the sensitivity of the MEMS device, and even makes the components of the MEMS device immobile and unusable. In this regard, the silicon wafer is required to be roughened, i.e., the surface of the first silicon planar layer 31 facing away from the substrate 1 needed to be roughened, as performed in step S105.

Figure 4:
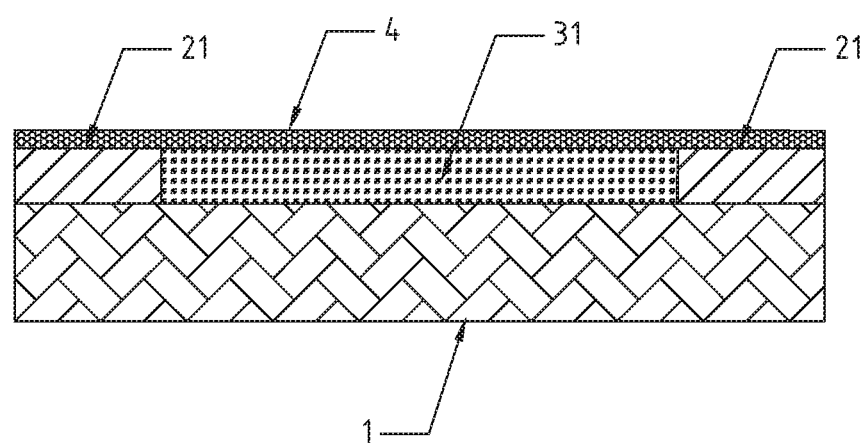
FIG. 4 is a structural schematic diagram of a silicon wafer after step S105 in the method shown in FIG. 1.

Step S105: a first film layer 4 is deposited on a side of the first silicon planar layer 31 facing away from the substrate 1. The first film layer 4 is made of a material including amorphous silicon, as shown in FIG. 4.

Step S106: the first film layer is removed by blanket etching. The formed silicon wafer is illustrated in FIG. 5.

Since the material of the first film layer 4 includes amorphous silicon, after blanket etching the first film layer 4 deposited on the first silicon planar layer 31, the rough first silicon layer 32 has a rougher surface.

Figure 5:
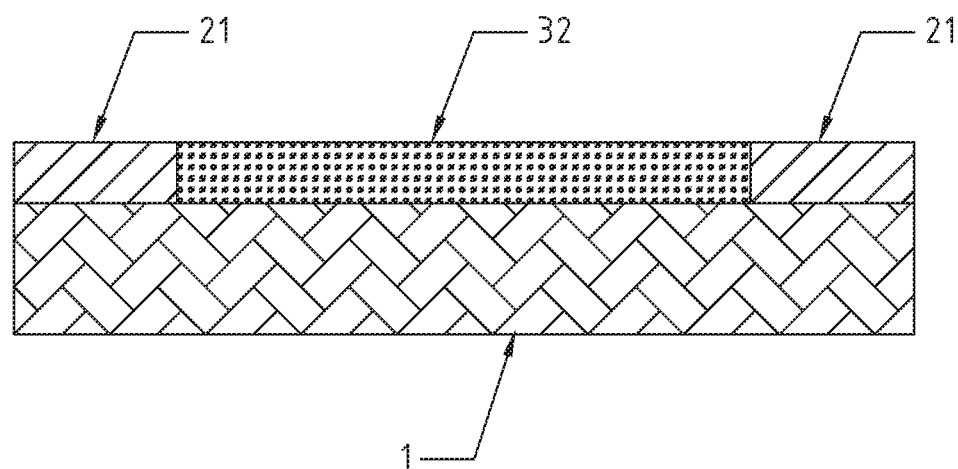
FIG. 5 is a structural schematic diagram of a silicon wafer after step S106 in the method shown in FIG. 1.

FIG. 5 illustrates the silicon wafer formed after the step S106. The rough first silicon layer 32 shown in FIG. 5 is rougher than the first silicon planar layer 31 shown in FIG. 3. That is, after step S106, the surface of the silicon wafer to be contacted with other film layers is rougher.

In the method for preparing a silicon wafer with a rough surface provided by the embodiment of the present invention, the first film layer 4 is deposited on the surface of the silicon that has been subjected to the planar planarization and then blanket etched. Thus, the roughness of the surface of the first silicon layer facing away the substrate is increased.

Figure 6:
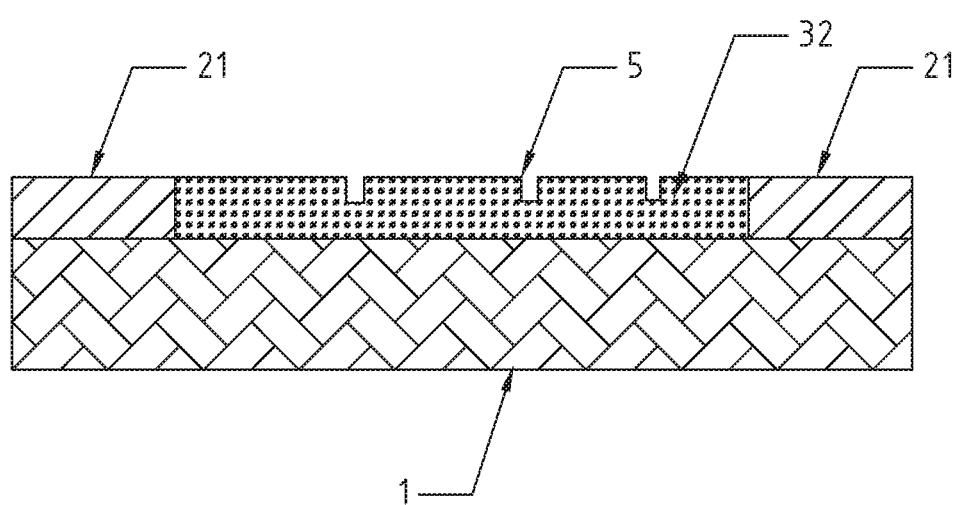
FIG. 6 is a structural schematic diagram of a silicon wafer having a rough surface according to an embodiment of the present invention.

In some cases, before the silicon wafer is applied to an MEMS device, the silicon wafer may be further etched to form grooves in the rough first silicon layer. That is, step S107 is additionally performed after step S106, and in step S107, the surface of the rough first silicon layer facing away the substrate is further etched to form the grooves, as shown in FIG. 6. When applying the silicon wafer to the MEMS device, the rough surface is maintained all the time. Therefore, when the silicon wafer is close to another film layer, the viscous force generated between the two surfaces approaching each other is reduced, thereby improving the sensitivity of the MEMS device and reducing the probability of the out-of-work MEMS devices.

In some embodiment, the first silicon layer may be made of amorphous silicon. That is, the first crystalline silicon planar layer 31 is an amorphous silicon layer. Through the above steps S101 to S106, the manufactured silicon wafer is an amorphous silicon wafer.

It should be understood that, the first silicon layer may be made of other silicon materials other than the amorphous silicon, such as monocrystalline silicon, polycrystalline silicon, and the like.

In another embodiment of the present invention, the thickness of the first film layer 4 is smaller than the thickness of the first silicon planar layer 31. Since the dielectric planar layer 21 in the silicon wafer has a fixed thickness, which is the same as the thickness of the first silicon planar layer 31, the blanket etching of the first film layer will be easier if the thickness of the first film layer 4 is smaller than that of the first silicon planar layer 31.

In another embodiment of the present invention, the thickness of the first film layer 4 is 0.05 µm to 0.6 µm, and the thickness of the first silicon planar layer 31 is 1 µm to 4 µm. That is, the thickness of the first film layer 4 is much smaller than the thickness of the first silicon planar layer 31, i.e., a thin first film layer 4 is deposited on the first silicon planar layer 31, which facilitates the blanket etching of the first film layer 4.

In another embodiment of the present invention, the step S105 of depositing the first film layer 4 on the side of the first silicon planar layer 31 facing away from the substrate 1 specifically includes: chemically or physically depositing the first film layer 4 on the side of the first silicon planar layer 31 facing away from the substrate 1.

In an embodiment of the present invention, the first film layer 4 is deposited on the side of the first silicon planar layer 31 facing away from the substrate 1 by plasma enhanced chemical vapor deposition.

In an embodiment of the present invention, the step S104 of performing planar planarization on the dielectric layer 2 specifically includes: performing chemical mechanical planarization on the dielectric layer 2, so as to expose the first silicon layer 3 and form the dielectric planar layer 21 and the rough first silicon layer 32. The polished dielectric layer 2 and the polished first silicon layer 3 both have an even thickness, and thus have smooth surfaces.

As another aspect of the present invention, an embodiment of the present invention provides a silicon wafer, as shown in FIG. 4. The silicon wafer includes a substrate 1, a dielectric planar layer 21, and a first silicon layer 31. The silicon wafer is prepared by the method according to the present invention and has rough surface.

A plurality of grooves 4 is provided in the surface of the first film layer 4 facing away from the substrate 1, and correspondingly, a plurality of protrusions is formed on the surface of the first film layer 4 facing away from the substrate 1. One protrusion is a portion between any two adjacent grooves 4.

In the silicon wafer with a rough surface provided by the embodiment of the present invention, the first film layer 4 s is deposited on the surface of the silicon that has been subjected to planar planarization and then blanket etched, thereby increasing a roughness of the surface of the first silicon layer facing away from the substrate. The surface of the first silicon layer facing away from the substrate can be further etched to form grooves and protrusions between the grooves, and the protrusions provide the roughness, so that the formed silicon wafer has a rough surface. When applying the silicon wafer to the MEMS device, the rough surface will be maintained all the time. Therefore, when the silicon wafer is close to another film layer, the viscous force generated between the two surfaces approaching each other is reduced, thereby by improving the sensitivity of the MEMS device and reducing the probability of the out-of-work MEMS devices.

In an embodiment of the present invention, a plurality of grooves 5 is formed in the surface of the rough first silicon layer 32 facing away from the substrate, as shown in FIG. 6, the portion between the grooves 5 can be considered as protrusion. The rough first silicon layer 32 having the grooves 5 is rough and will be maintained in the subsequent preparation of the MEMS. When the silicon wafer approaches to another film layer, the viscous force generated therebetween is reduced, and thus the sensitivity of the MEMS device is improved and the probability of out-of-work MEMS device is reduced.

The above are merely some preferred embodiments of the present invention, but are not intended to limit the scope of the present invention. Any modifications, equivalent replacements, improvements made within the principle of the present invention shall be included in the protection scope of the present invention.

What is claimed is:

1. A method for preparing a silicon wafer with a rough surface, comprising:
   forming a substrate, wherein the substrate has a first region, a second region, and a third region along a first direction, and the first direction is perpendicular to a thickness direction of the substrate;
   depositing a first silicon layer on a surface of the substrate in the second region;
   depositing a dielectric layer on the surface of the substrate in the first region and the third region and on a surface of the first silicon layer facing away from the substrate;
   performing planar planarization on the dielectric layer to expose the first silicon layer and form a dielectric planar layer and a first silicon planar layer;
   depositing a first film layer on a side of the first silicon planar layer facing away from the substrate, wherein the first film layer is made of a material comprising amorphous silicon; and
   blanket etching the first film layer to remove the first film layer.

2. The method as described in claim 1, wherein the first film layer and the first silicon layer are made of the same material.

3. The method as described in claim 1, wherein the first film layer has a smaller thickness than the first silicon planar layer.

4. The method as described in claim 3, wherein the thickness of the first film layer ranges from 0.05 µm to 0.6 µm, and the thickness of the first silicon planar layer ranges from 1 µm to 4 µm.

5. The method as described in claim 1, wherein said depositing the first film layer on the side of the first silicon planar layer facing away from the substrate comprises: chemically or physically depositing the first film layer on the side of the first silicon planar layer facing away from the substrate.

6. The method as described in claim 1, wherein said performing planar planarization on the dielectric layer comprises: performing chemical mechanical planarization on the dielectric layer.

7. The method as described in claim 1, further comprising, after said blanket etching the first film layer, etching a surface of the first silicon planar layer facing away from the substrate to form grooves in the surface of the first silicon planar layer facing away from the substrate.

8. A silicon wafer, comprising:
   a substrate having a first region, a second region, and a third region along a first direction, the first direction being perpendicular to a thickness direction of the substrate;
   a dielectric planar layer disposed on the substrate in the first region and the third region; and
   a rough first silicon layer disposed on the substrate in the second region,
   wherein the silicon wafer is prepared by the method as described in claim 1 and has a rough surface.

* * * * *